United States Patent [19]

Yang et al.

[11] Patent Number: 5,157,729
[45] Date of Patent: Oct. 20, 1992

[54] METHOD AND APPARATUS FOR AUTOMATIC ADDRESS SETTING FOR RECORDING AND REPLAY

[75] Inventors: Feng-Cherng Yang, Chang-Hua; Ming-Horng Shiau, Yung-Lin, both of Taiwan

[73] Assignee: Industrial Technology Research Institute, Hsin-Chu, Taiwan

[21] Appl. No.: 365,640

[22] Filed: Jun. 13, 1989

[30] Foreign Application Priority Data

Aug. 25, 1988 [JP] Japan ............................ 63-211559

[51] Int. Cl.$^5$ .................... G10L 3/00; H04M 1/65
[52] U.S. Cl. .............................. 381/47; 381/51; 379/88
[58] Field of Search ................... 381/29–41, 381/47, 51–53; 364/513.5; 367/198; 340/825.44; 379/88; 369/47, 60, 63, 65; 395/2

[56] References Cited

U.S. PATENT DOCUMENTS

| | | | |
|---|---|---|---|
| 4,121,058 | 10/1978 | Jusko et al. | 381/52 |
| 4,281,994 | 8/1981 | Dell et al. | 381/36 |
| 4,389,541 | 6/1983 | Nakano et al. | 381/36 |
| 4,698,776 | 10/1987 | Shibata | 364/513.5 |
| 4,807,289 | 2/1989 | Nakajima | 381/36 |
| 4,811,397 | 3/1989 | Nakajima | 364/513.5 |
| 4,881,205 | 11/1989 | Aihara | 379/88 |
| 4,959,852 | 9/1990 | Kern et al. | 379/88 |
| 5,008,942 | 4/1991 | Kikuchi | 381/51 |

*Primary Examiner*—Emanuel S. Kemeny
*Assistant Examiner*—M. Doerrler
*Attorney, Agent, or Firm*—Darby & Darby

[57] ABSTRACT

A method and apparatus for address setting for speech recording and replay, includes an apparatus for storing a direct current (DC) voltage with a high frequency signal in the dynamic random access memory (DRAM) as an index for replay. During recording, the user can enter speech of different durations. During replay, the system automatically repeats the exact contents without any other background noise or noise speech at the end of the desired message. The apparatus includes a wave clearer, a direct current voltage generator, a high frequency signal generator, a DC voltage detecting and time setting circuit, a resetter, and a recording and replay signal generator.

19 Claims, 11 Drawing Sheets

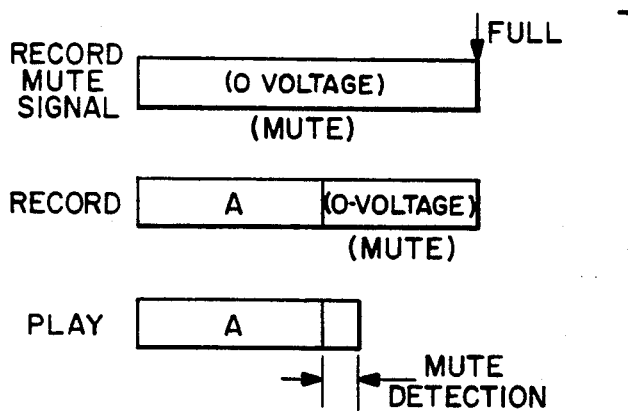
FIG. 4A
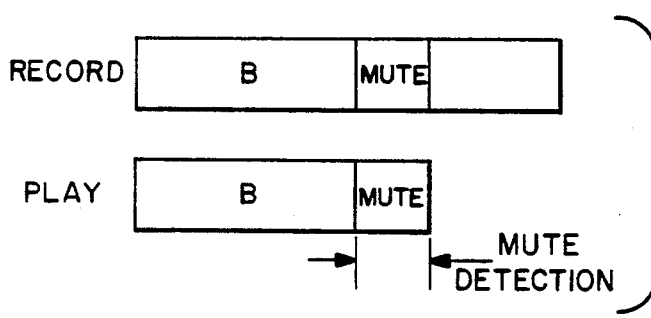
FIG. 4B
FIG. 5
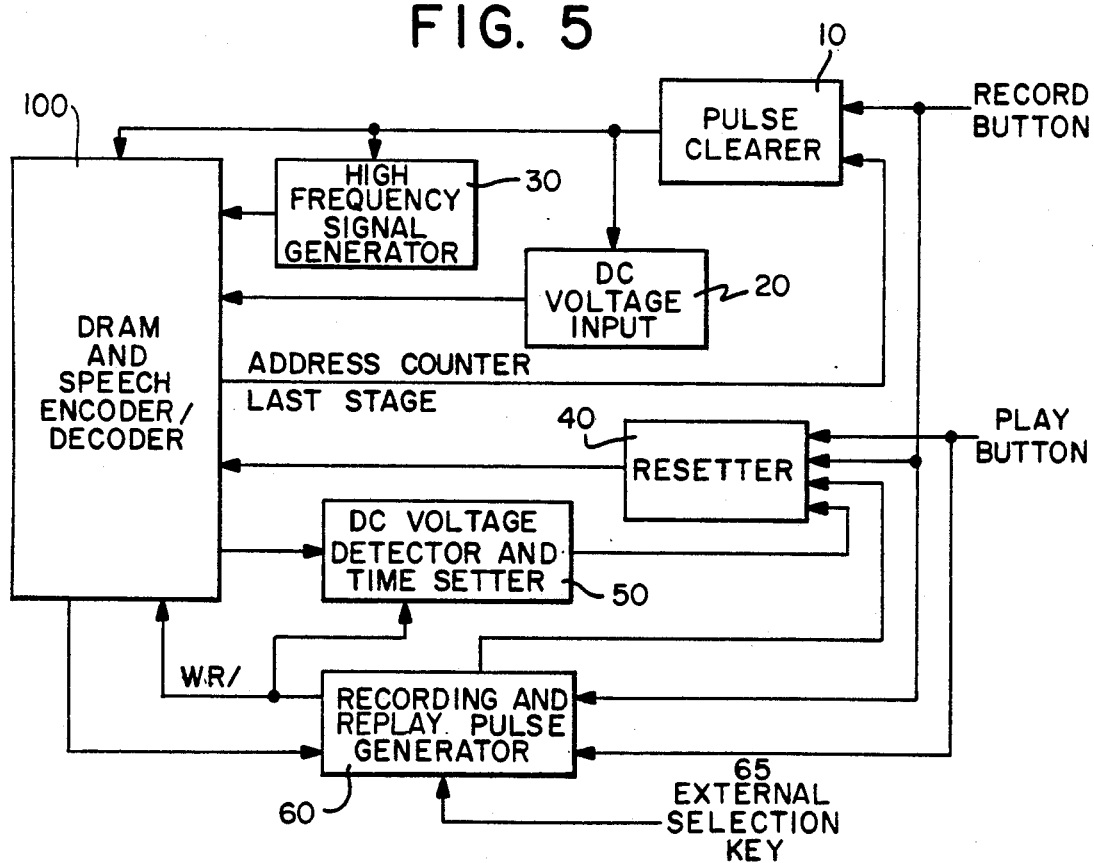

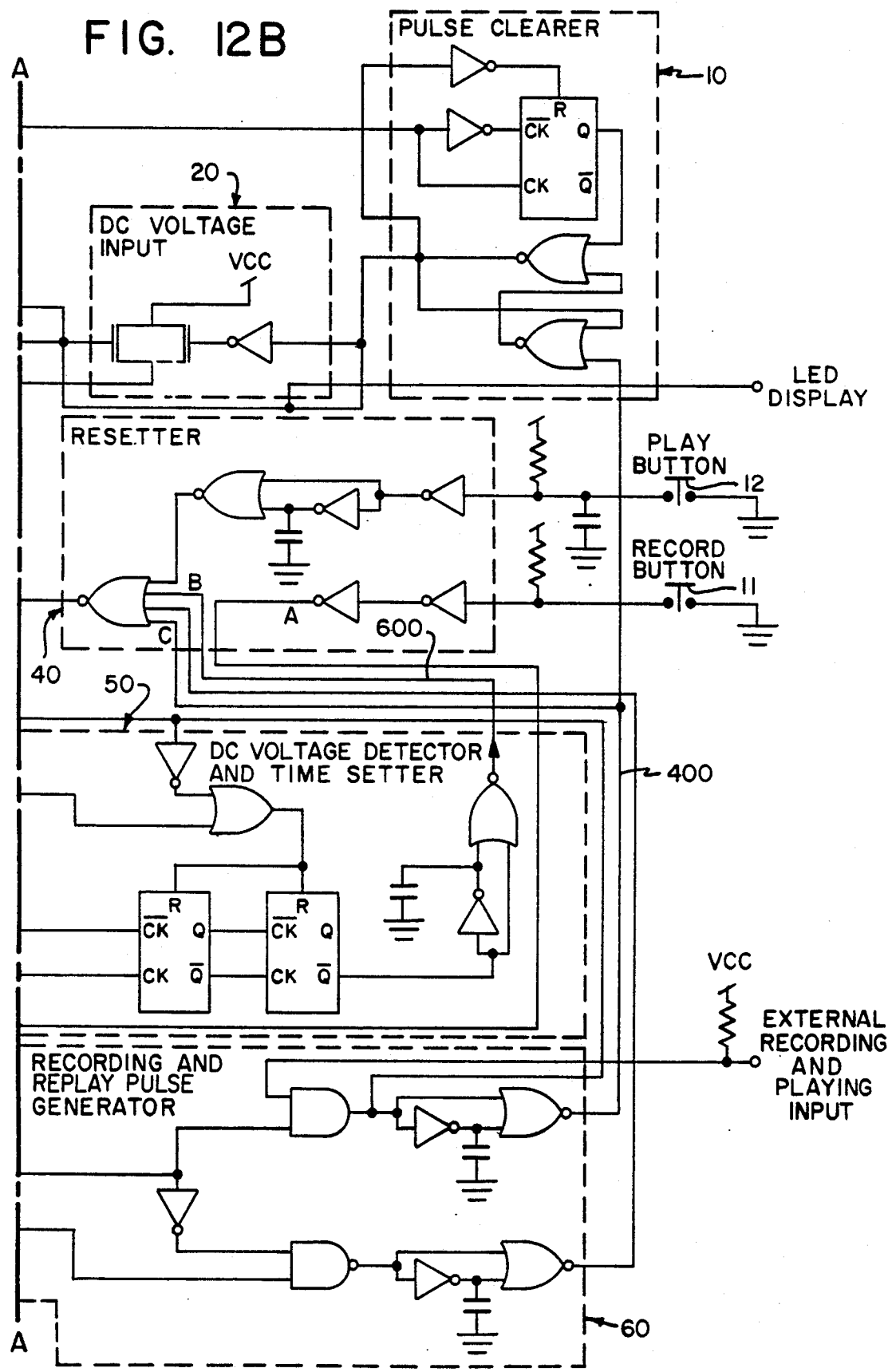

5,157,729

METHOD AND APPARATUS FOR AUTOMATIC ADDRESS SETTING FOR RECORDING AND REPLAY

FIELD OF THE INVENTION

This invention relates to a method and apparatus for the automatic address setting for speech recording and replay.

The invention can be employed in various applications, such as toys, recursive public announcement systems, advertising announcements, telephone answering machines, language learning recorders, and other arrangements which require different recording time durations and wherein the recorded contents can be frequently renewed and replayed. The invention is not limited to these specific applications.

BACKGROUND OF THE INVENTION

Recently, dynamic random access memory ("DRAM") has been commonly used for recording and replaying speech in devices such as toys, language learning recorders, and telephone answering machines. Usually, the speech recording/playback mechanism of such devices have fixed time periods for recording and replay. The memory records background noise if the speaker enters a message shorter than the preset time period. Even a speaker-time-dependent recorder retains a portion of the previous recorded message not recorded over by a subsequent message of shorter duration.

Two conventional techniques for recording and replaying speech are:

1. The machine replays automatically after detecting a certain length of background noise. Such a circuit is illustrated in FIG. 1. In this arrangement, the input signals are recorded for a fixed period of time, as determined by the time counter, and the output is recorded for the fixed period whether or not any input signals are received, as seen in FIG. 2. Thus, the portion A of the first message is recorded over by the second message C, but the portion B of the first message is not recorded over, and is repeated during the replay of the message. This arrangement has the disadvantage that noise is played upon replay. In addition, it does not replay correctly when the speaker speaks slowly or pauses. Further, the machine replays previous messages that were not recorded over, when the second message is shorter than the first.

Thus, because the memory is not cleared before making a second recording, the previous message is replayed if a later recorded message is shorter than an earlier recorded message. For example, if the DRAM is first loaded with a message content "1 2 3 4 5 6 7 8 9 10 11 12 13 14 15 16 17 18 19 20", and a later message only has the content "A B C D", the playback will contain the message "A B C D 5 6 7 8 9 10 11 12 13 14 15 16 17 18 19 20", even though the desired message is "A B C D—A B C D—A B C D— etc."

2. In the second conventional arrangement, a central processing unit (CPU), such as a micro-processor including a DRAM, controls the start and end of the recording and replay operations (as seen for example in FIG. 3). The start and end addresses of the DRAM are saved at a determined location in the DRAM, so that it is only necessary to record during times at which speech occurs. This arrangement has the disadvantage that complicated circuits are required because of the CPU, and some waste of the DRAM space occurs.

Thus, known systems have the following disadvantages:

1. The system may replay incorrectly when the speaker speaks too slowly or when there is a pause in a sentence.
2. DRAM may be required to store the start and stop addresses.
3. The circuit structure may be complicated if a CPU is required.
4. The time required to clear the DRAM is increased as an increasing number of DRAM circuits are required for recording.

SUMMARY OF THE INVENTION

The present invention is directed to a method and apparatus overcoming these disadvantages.

The method and apparatus according to the invention provide for the automatic address setting for storing and replaying speech information. Briefly stated, an apparatus is provided for storing a DC voltage having a high frequency signal in the DRAM as a replay index. While recording, the user can enter contents having various time spans. During replay, the system automatically repeats the exact contents without any other background noise at the end of the desired message. The apparatus includes a pulse clearer, a direct current voltage generator, a high frequency signal generator, a DC voltage detecting and time setting circuit, a resetter, and a recording and replay signal generator.

According to the present invention, a high frequency signal is used to record Low logic level speech codes to clear those original existing speed codes stored in DRAM. It is important that the Low level signal, such as a DC signal, is mute and different from the phonetic codes of background noise. This is illustrated in FIG. 4. The Low level (DC voltage) acts as an index in place of the conventional technique wherein DRAM memory space is used to record the starting and ending addresses. Users can record speech signals of various lengths, and, during replay, the system replays from the start of the message whenever a short continuous Low signal level is detected. There is no need to wait until the whole memory is decoded, and any portion of the memory that has not been recorded over will not be replayed.

In a second embodiment of the invention, a DC voltage is inserted at the end of the time that speech has been recorded. During replay, this voltage serves as a controlling signal for replay.

The above two embodiments of the invention thus have different structures, but function in the same manner. The major difference between the present invention and conventional arrangements and methods is that the DC voltage and the background noise voltage are totally different. The present invention does not result in misplay due to misjudgment. Thus, conventional arrangements detect background noise and count the time with time setting circuits, so that the system replays when a certain time period of background noise is detected, as discussed above. In conventional arrangements, the message content is thus in danger of being cut off if the speaker speaks slowly, or if he pauses in the process of recording. For example, if the speaker intends to count from 1 to 8, but pauses after the number 4, background noise will be recorded between the recording of the numbers 4 and 5. Upon replay, the background noise following the playback of the number 4 will effect the resetting of the address counter, so that the sequence 1-2- 3- 4 will be repeated, since conventional arrangements reset the address counter upon detection of background noise.

In accordance with the present invention, however, it is desired to hear the background noise between the playback of the numbers 4 and 5, and accordingly the system of the invention permits such playback.

The method and apparatus of the invention provides the optimum output, so that it is effective for repetitive public announcement systems, advertising announcements, telephone answering machines, and language learning recorders. People normally record for different time durations, while the DRAM has a fixed recording space, so that it is difficult for the speaker to time his speaking period to be the same as that of the recording. In the absence of the system of the invention, the conventional record and replay system either waits during blank periods, or replays an unintended message. In the arrangement of the present invention, however, the system replays only the desired speech signals since the DRAM is cleared by a Low level signal.

BRIEF DESCRIPTION OF THE DRAWINGS

In order that the invention may be more clearly understood, it will now be-disclosed in greater detail with reference

FIGS. 4A and 4B are timing diagrams illustrating the operation of the present invention FIG. 5 is a block diagram of a first embodiment of the invention;

DETAILED DESCRIPTION OF PREFERRED EMBODIMENTS

Figure 1:
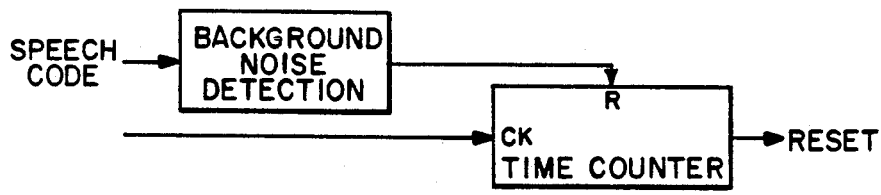
FIG. 1 is a block diagram of a conventional system.
Figure 2:
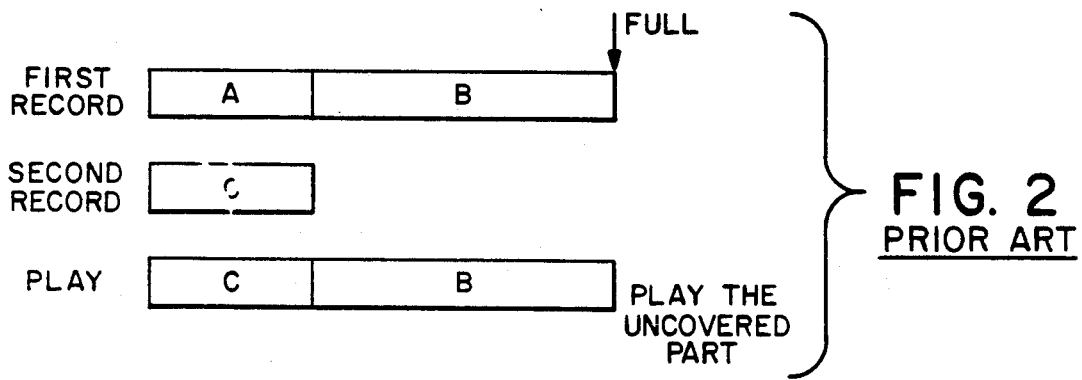
FIG. 2 is a timing diagram illustrating the operation of the system of FIG. 1.
Figure 3:
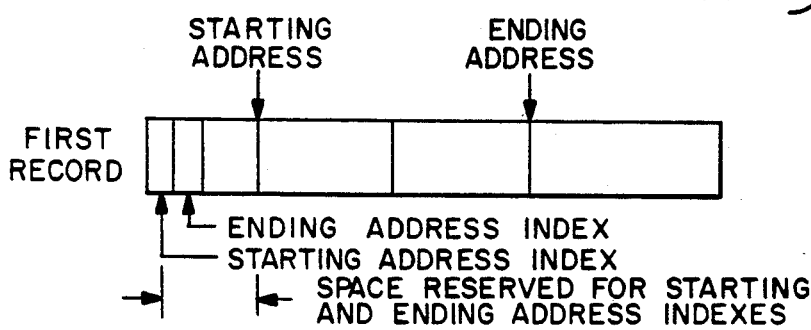
FIG. 3 is a timing diagram illustrating the operation of another known system.
Figure 3:
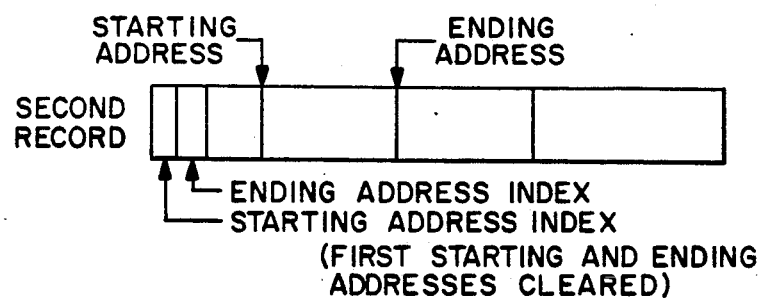
Figure 3:
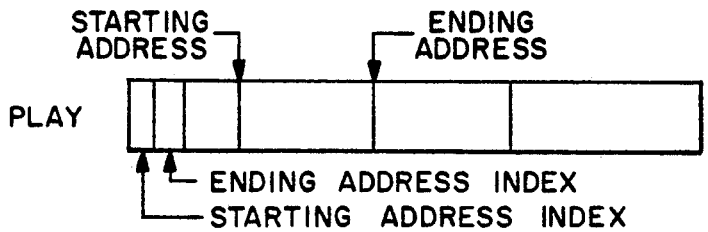

Two preferred embodiments of the invention will be discussed hereinafter. The first embodiment uses a high frequency signal to set a DC voltage into its DRAM whenever original existing signals are erased and new speech signals are recorded. During recording, the user can record speech having various time spans and the system automatically repeats the contents during replay. The second embodiment records the speech signals in DRAM and inserts a DC voltage signal when the recording is finished. The system then automatically repeats the contents when the Play Button is depressed. Both embodiments use the recorded DC voltage signal, which is a mute signal, as a replay index.

Referring now to FIGS. 5-12, therein is illustrated a system in accordance with the first embodiment of the invention.

As illustrated in FIG. 5, the present invention includes a pulse clearer 10, a DC voltage input setter 20, a high frequency signal generator 30, a resetter 40, a DC voltage detector and time setter 50, and a recording and replay pulse generator 60. Suitable embodiments of these circuits will be described in greater detail later with respect to FIGS. 6-12. The circuit illustrated in FIG. 5 further includes a conventional DRAM and Speech Encoder/Decoder 100.

Figure 6:
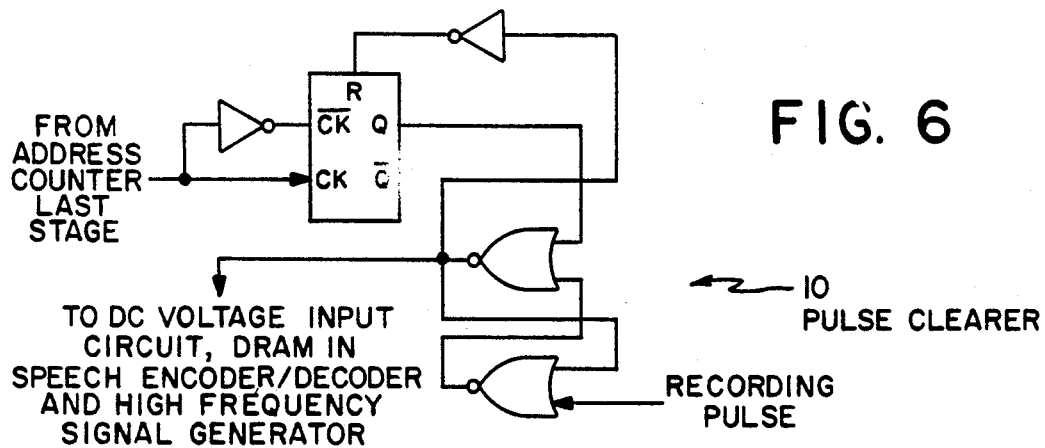
FIG. 6 is a block diagram of a pulse clearer for use in the system of FIG. 5.

When the power is on, the address counter of the DRAM and Speech Encoder/Decoder 100 outputs a signal to the pulse clearer 10, resulting in a Low output level signal from the pulse clearer (see FIG. 6). To record, the user depresses the Record Button 11 (FIG. 12), and, in response thereto, the recording and replay pulse generator 60 outputs a Low WR/ (i.e. active low Write) signal. This causes the Speech Encoder/Decoder to start recording the message in the DRAM. At the same time, the Low WR/ signal controls the DC voltage detector and time setter 50 so that the circuit stops counting time, i.e., the time setter 50 outputs a Low level signal when recording is in process. The WR/ signal received by the DRAM causes the DRAM to generate a High level signal input applied to the pulse clearer 10 and instructs the high frequency signal generator 30 to send a normal high frequency pulse to the Speech encoder/decoder. This High signal also controls the DC voltage input 20 to apply a DC voltage to the input of the Speech Encoder/Decoder. A DC (mute) voltage is set into all the DRAMS in high frequency at the same time, so the time required for clearing the DRAMs does not increase with the increasing number of DRAMs used for the previous recording. When all memories are full, the address in the address counter of the Speech Encoder/Decoder 100 is at the last stage and a High logic level signal is sent to the input of the wave clearer 10. In response, the output of the pulse clearer 10 changes from a High level to a Low level. This Low level causes the DC voltage input circuit 20 to stop applying a DC voltage to the Speech Encoder/Decoder 100, and the high frequency signal generator 30 stops generating high frequency signals and begins to output speech codes at the normal recording frequency.

Preferably, the entire clearing process takes approximately 0.5 second. In other words, the pulse clearer 10 generates a High level output lasting for 0.5 second. This High logic level signal thus:

causes the generation of high frequency signals which are sent to the Speech Encoder/Decoder;

enables the DC voltage input setter 20 to generate a DC voltage for application to the Speech Encoder/Decoder;

causes the clearing of all of the DRAMs at the same time; and causes the controlling of any LED display or time signals in the process of clearing.

After this 0.5 second clearing step, the pulse clearer 10 resumes its Low level output, and:

the high frequency signal generator is caused to stop generating a high frequency signal;

the DC voltage input 20 is instructed to stop operating;

the clearing of the DRAMs is stopped;

the clearing process ends, and the speech signals start being saved in the Speech Encoder/Decoder and DRAM system 100.

A. When the external selection key 65 is controlled to apply a High logic level output to the circuit:

a) If the user continues to depress the Record Button 11 when all the DRAMs are filled, the address counter in the Speech Encoder/Decoder 100, after finishing one DRAM cycle, generates a High logic level output. This High output controls the record and replay pulse generator 60 to change its output from a Low level to a High level, and the decoding (replay) starts. A complete cycle is replayed after the Record Button 11 is depressed b) In a second situation that may occur, the speaker releases the Record Button 11 before the DRAMs are full and the signal input to the circuit from the Record Button to the circuit changes from a Low level to a High level. This High level signal then instructs the recording and replay pulse generator 60 to output a High level signal, thereby starting the decoding (replay).

B. When the external selection key 65 is set to apply a Low logic level to the circuit:

a) If the user continues to depress the Record Button 11 when the DRAMs are full, the Speech Encoder/decoder continues to record new speech signals. The address counter will not generate a High output after finishing one DRAM cycle, so the recording and replay pulse generator 60 will not effect a decoding (replay) process. The system starts decoding (replay) only when the speaker releases the Record Button. It replays the last complete DRAM cycle recorded before the Record Button is released.

b) Like the above discussed condition b) when the external selection key is set to a High level, the record signal changes from a Low level to a High level when the speaker releases the Record Button before the DRAMs are full. The recording and replay pulse generator 60 starts decoding (replay) when this High (DC) signal is detected.

There are three different situations that may occur in the above recording and replay:

If the user continues to depress the Record Button when the DRAMs finish running one cycle, the system replays automatically.

If the user continues to depress the Record Button when the DRAMs finish running one cycle, the DRAMs continue recording a new input message. The system replays only when the Record Button is released and it replays the contents recorded in the last cycle.

If the user releases the Record Button before one DRAM cycle is completed, the system replays the recorded message content.

i) Under the first condition, when the external selection input is set to a High level, the address counter in the Speech Encoder/Decoder applies a High level signal to the recording and replay pulse generator 60 when the DRAMs are filled with an input message. The recording and replay pulse generator thus changes its WR/ output from a Low level to a High level. A pulse generated thereby is sent to the resetter 40 and to the speech encoder/decoder to reset the address counter. The High WR/ output of the recording and replay wave generator 60 controls the DC voltage detecting and the time setting circuit 50 to start detecting the DC voltage and time counting. The process is still controlled by the DC voltage comparator. During the DRAM speech signal decoding (replay) process, the DC voltage comparator keeps outputting a High level signal voltage which keeps the time setter 50 on a reset mode (stop counting). The DC voltage detector and time setter 50 do not function because all the DRAMs are full, there is no blank DC voltage after decoding, and the comparator outputs a High level.

ii) The second condition is the same as the first except that when the external selection input is set at a Low level, the recording and replay pulse generator 60 will not generate a High WR/ output when the DRAMs are full. The system does not replay until the Record Button is released. A pulse will not be sent to the resetter 40 to reset the address counter, and it continues to record a new message. When the speaker releases the Record Button, a complete DRAM cycle of content will be replayed.

iii) The third condition is that the Record Button is released before the DRAMs are full. Regardless of how the external selection key 65 is set, the recording and replay pulse generator 60 generates a High WR/ output which instructs the DC voltage detection and time setting circuit 50 to detect a DC voltage and start time counting. After a determined time period is counted, a reset pulse will be sent to the address counter. The address counter starts from the beginning, namely, the DRAM is decoded from the beginning. The decoded content can be replayed repetitively and only pauses shorter than 0.5 second will be replayed. During decoding (replay), a DC (mute) voltage is detected whenever there are pauses. It is different from a background noise which gives alternating current voltage noise signals carried on ½ Vcc. The comparator 5 can easily distinguish the signals and control the time counter 50 to count only when the DC voltage exists.

All of the three situations enable the speech decoder and DRAM to replay. The user does not have to touch the Play Button 12 again in order to replay the message content again. The system will not replay all the blank space in DRAM, it replays the recorded message content only. If a user wants to listen to the beginning of the message content in the middle of the replay process, the Play Button 12 is pushed.

FIGS. 6–11, 13, 14, and 16 illustrate circuit details for suitable circuits that may be employed in the disclosed arrangement of the invention. Since each of these circuits is illustrated employing conventional symbols, a detailed listing of the circuit connections will be omitted as superfluous.

The pulse clearer illustrated in FIG. 6:

When the power is on, the output of the pulse clearer 10 is set to Low level by the address counter. The output becomes High when the Record Button is depressed. This High level is output to the DC voltage input circuit and to the High Frequency counter to effect clearing. The Address Counter applies a Low signal to the pulse clearer again when the clearing process has been completed The DC Voltage input circuit illustrated in FIG. 7:

The DC voltage input circuit 20 is a switching circuit controlled by the pulse clearer. When the Record Button is not depressed, the pulse clearer outputs a Low level to the DC voltage input circuit, and the circuit is off. When the Record Button is depressed, the pulse clearer outputs a High level to the DC voltage input circuit, and turns the input circuit on. The DC voltage input circuit will then output a DC voltage to the Speech Encode/Decode circuit to enable all of the DRAMs to be cleared.

Figure 8:
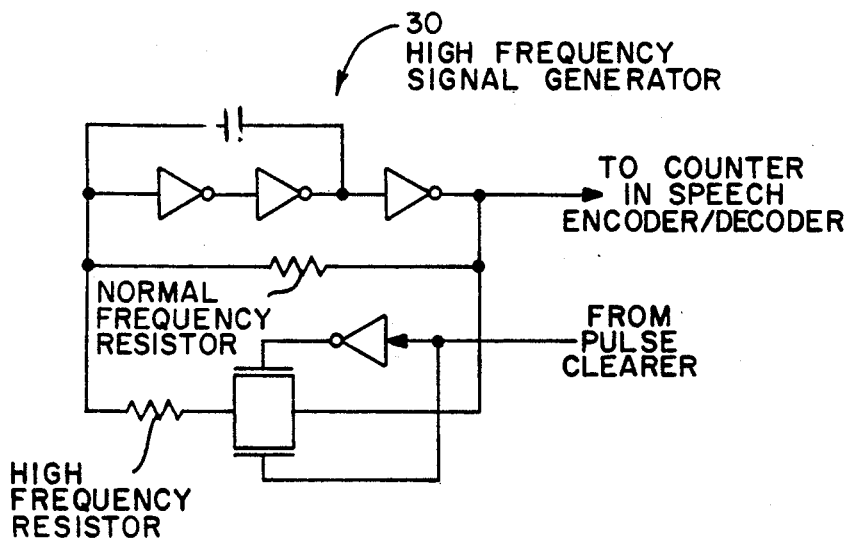
FIG. 8 is a block diagram of a high frequency signal generator for use in the system of FIG. 5.

The high frequency signal generator of FIG. 8:

The high frequency signal generator 30 is comprised of a high frequency oscillating circuit. The circuit is controlled by the output of the wave clearer. When the Record Button is not pushed, the output of the wave clearer is at Low logic level, and the high frequency signal generator is controlled to generate "normal" frequency oscillations. When the Record Button is depressed, the output of the wave generator is High, and the high frequency generator is instructed to generate a high frequency oscillation for application to the address counter and the DRAM for the clear process.

Figure 9:
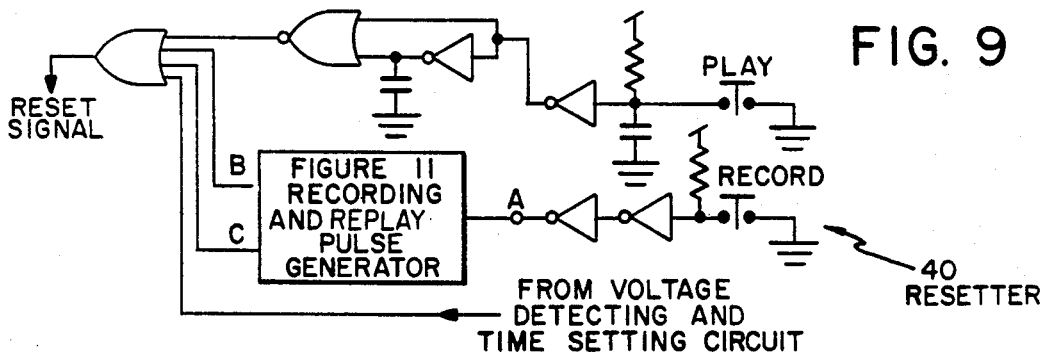
FIG. 9 is a block diagram of a resetter for use in the system of FIG. 5.

The resetter of FIG. 9:

The resetter 40 provides a reset signal for the address counter, to reset the counter to the start of its memory. The resetter provides such an output under four conditions:

1. When the Record Button is depressed and a clearing process starts;
2. When the Play Button is depressed and replay starts;
3. When recording is over;
4. When the DC voltage detecting and time setting circuit finishes processing.

Figure 10:
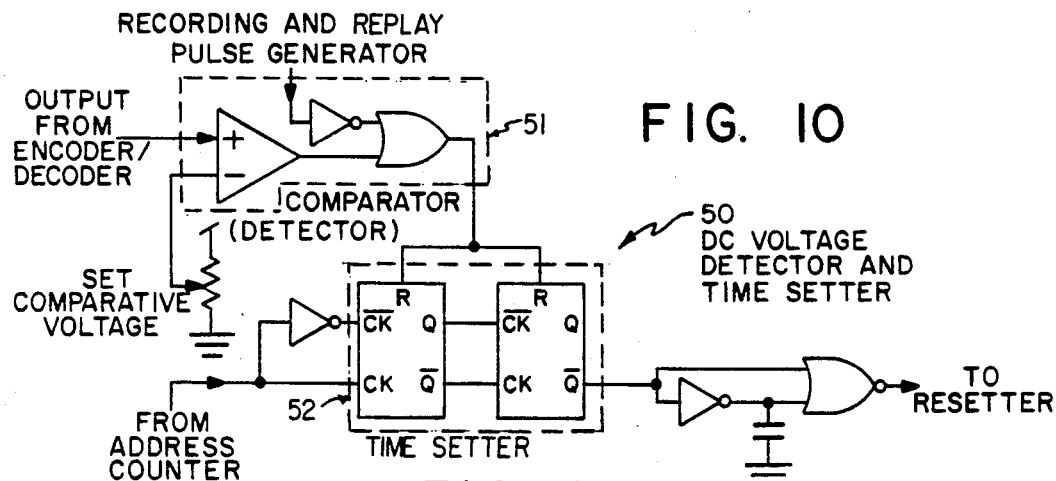
FIG. 10 is a block diagram of a time setter for use in the system of FIG. 5.

The DC voltage detector and time setter of FIG. 10:

The DC voltage detector and time setter 50 is comprised of a voltage comparator 51 and a time counter 52. It is controlled by the recording and replay wave generator. In the Recording mode, the device will not function since the comparator works either during recording or during replay, but the time setting circuit works only when it is in the replay mode. once the DC voltage sent from the DRAM lasts longer than the preset time period (which is user dependent), the device outputs a reset pulse to the resetter.

Figure 11:
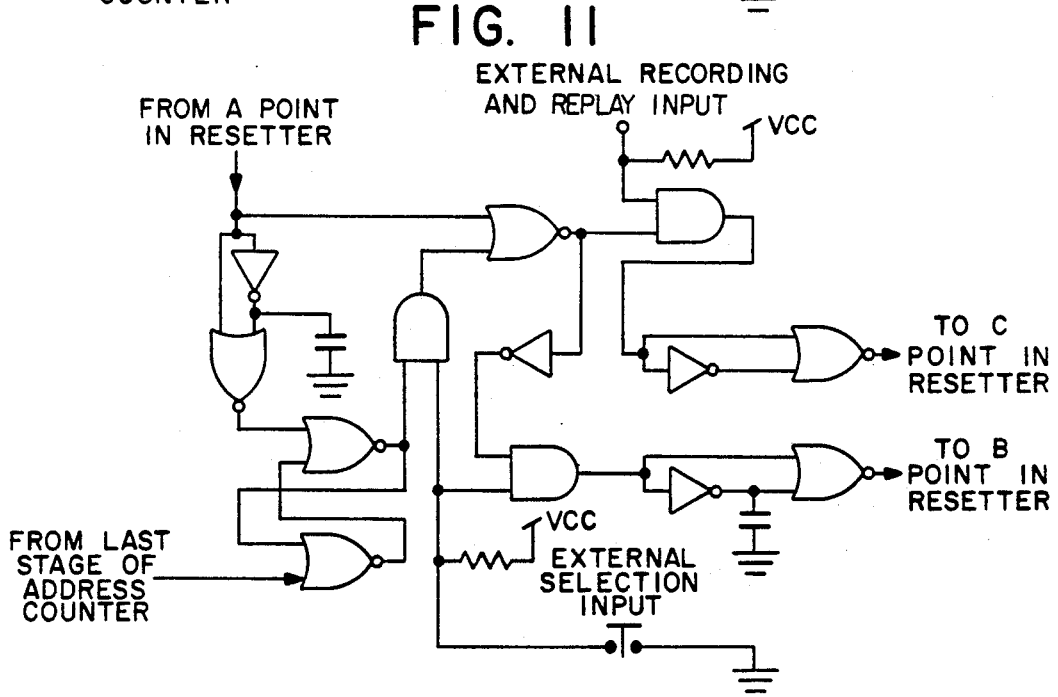
FIG. 11 is a block diagram of a recording and replay pulse generator for use in the system of FIG. 5.

The recording and replay pulse generator of FIG. 11:

The record and replay pulse generator 60 is controlled by the Record Button and the external recording and replay input. When neither of the controllers output a signal, the WR/ output of the record and replay pulse generator is at High logic level. The system is then in the replay mode. When the Record Button is depressed or when the external recording and replay input is at a Low level, the WR/ output of the record and replay wave generator becomes Low and the circuit generates a reset signal for the resetter and the clearing of the DRAM starts. When the external selection inputs a Low level, the end signal of the address counter does not change the WR/ output of the record and replay wave generator, i.e. when the Record Button is depressed, new speech content will be recorded. When the external selection inputs a High level, the end signal of the address counter will change the WR/ output of the record and replay pulse generator. Even if the Record Button is still depressed, an end signal will be sent to change the WR/ output of the record and replay pulse generator to a High level after the counter records for one cycle. That is, the system replays automatically after one DRAM cycle is completed. A reset pulse is generated when the Record Button is released or when the external selection input goes to a High level and the system starts to replay.

Figure 13A:
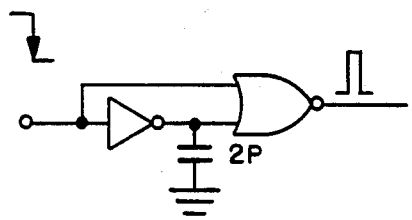
FIG. 13A and 13B are block diagrams of pulse generators for use in the systems of FIGS. 5 and 12.
Figure 13B:
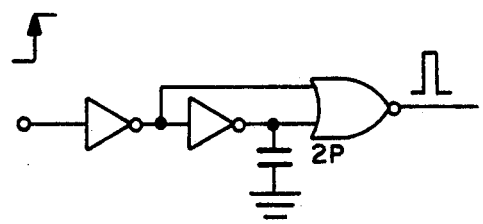

The pulse generators of FIG. 13:

These are conventional pulse generation circuits.

Figure 14A:
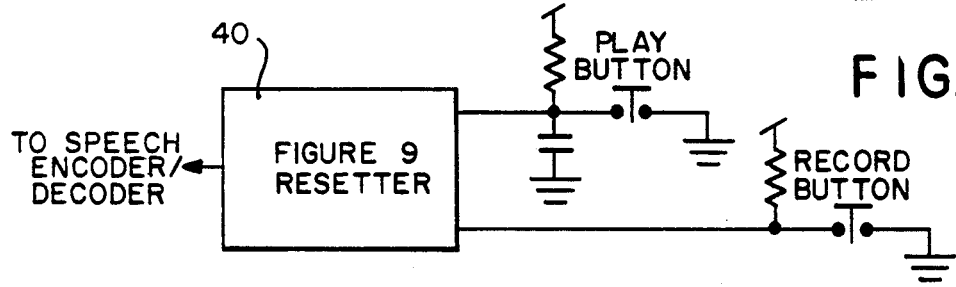
FIGS. 14A and 14B are block diagrams of circuits for the Record and Play Buttons for use in the systems of FIGS. 5 and 12.

The recording and replay button circuits of FIG. 14:

These circuits show variations of the connections of switches for achieving the functions of the Play and Record buttons.

Figure 15:
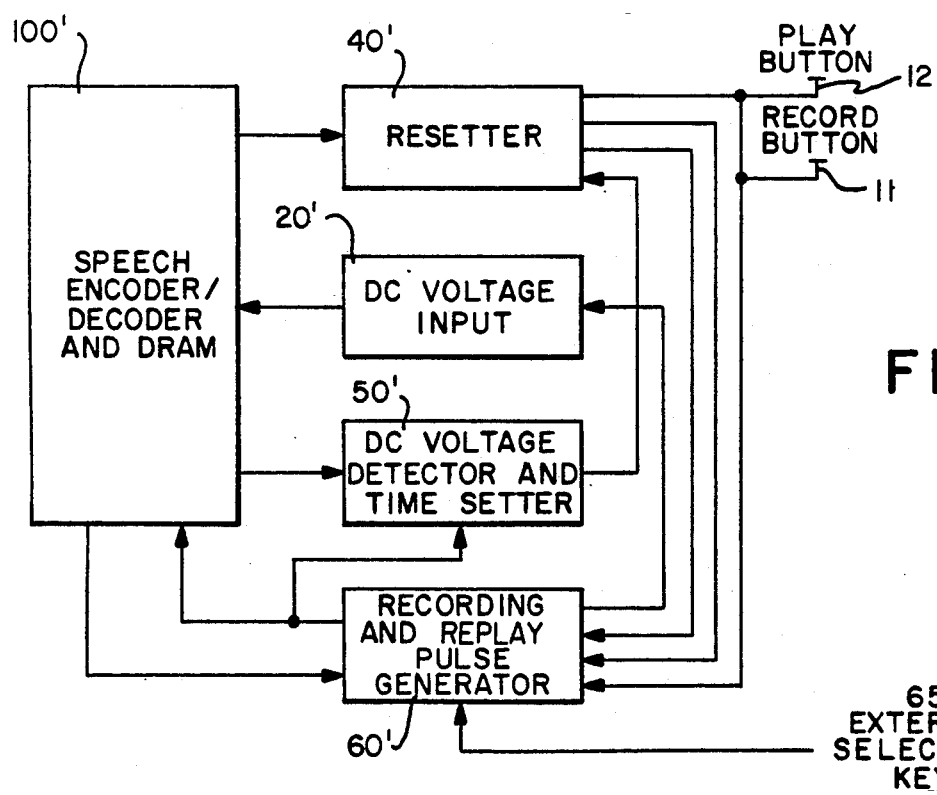
FIG. 15 is a block diagram of a second embodiment of the invention.
Figure 16:
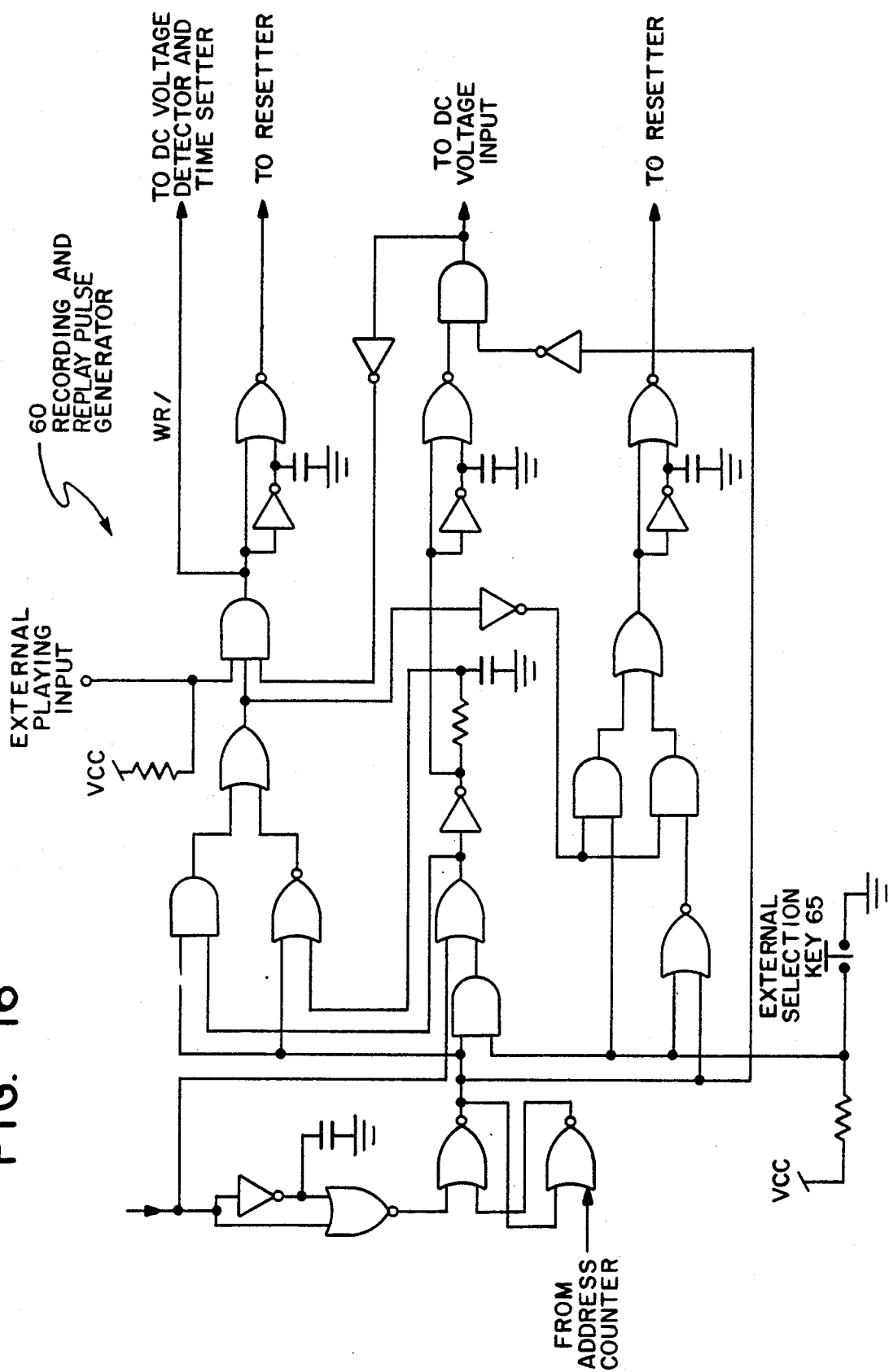
FIG. 16 is a block diagram of a recording and replay circuit generator for use in the system of FIG. 15.
Figure 17A:
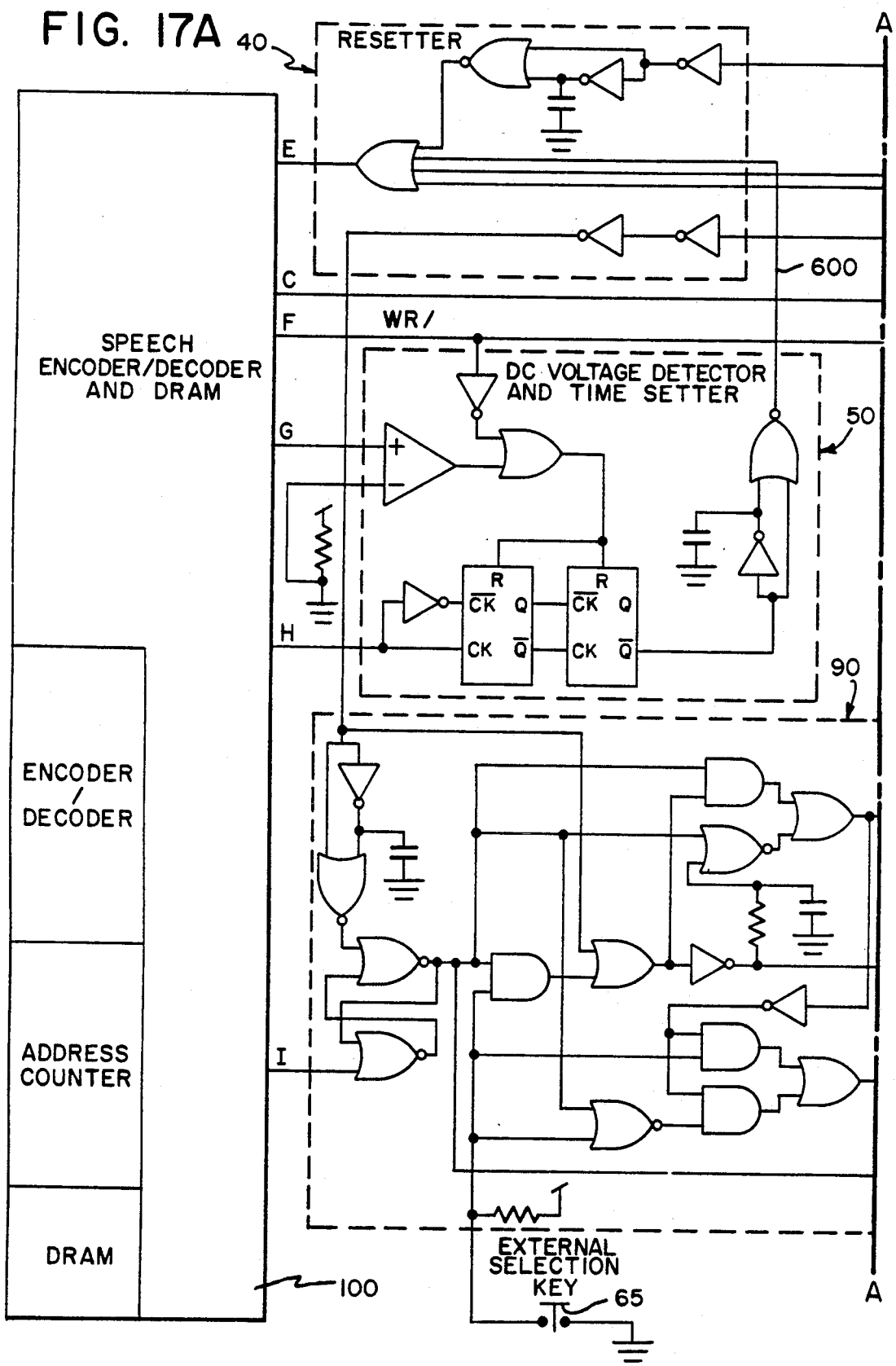
FIG. 17 is a block diagram of a more detailed structure of the system of FIG. 15.
Figure 17B:
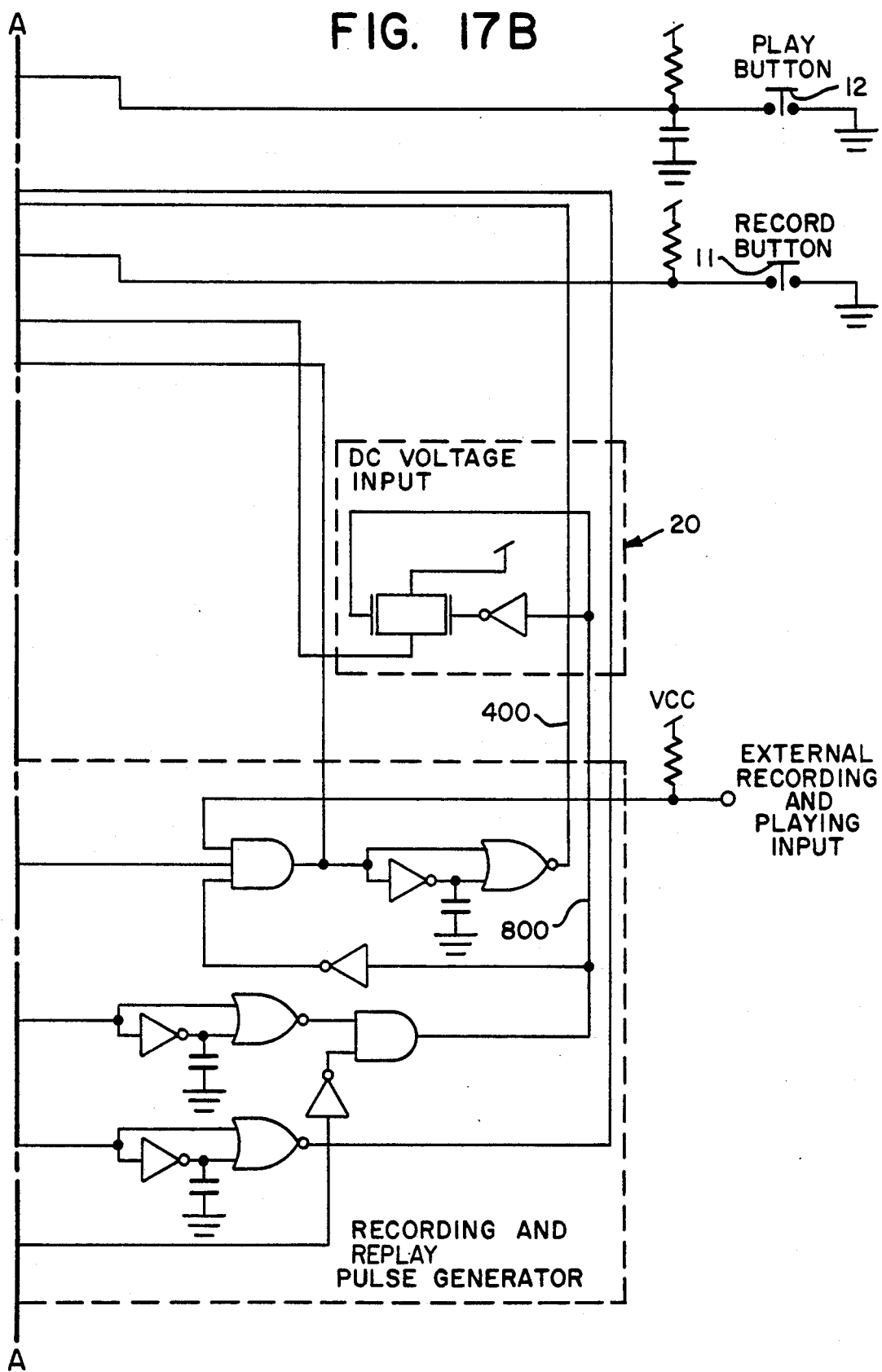

(II) The second embodiment of the invention is illustrated in the block diagram of FIG. 15. This arrangement is comprised of a DC input generator 20' (see FIG. 7), a resetter 40' (see FIG. 9), a DC voltage detector and time setter 50, (see FIG. 10), recording and replay pulse generator (see FIG. 16) and a speech encoder/decoder DRAM 100'. FIG. 17 shows this arrangement in greater detail.

The arrangement of FIG. 15 does not employ a pulse clearer to clear the memory, the user just depresses the Record Button 11 while recording.

A. When the external selection key 65 is set to apply a High logic level to the system (FIG. 17):

a) If the speaker depresses the Record Button 11 after the DRAMs are full, the address counter in the Speech Encoder/Decoder 100 will count one cycle and then generate a High output to cause the recording and replay generator to generate a High WR/ output which enables decoding (replay). Namely, the system replays automatically after recording for one DRAM cycle.

b) If the speaker releases the Record Button 11 before the DRAMs are full, the voltage applied by the Record Button is temporarily held. During this delay the voltage controls the DC voltage input generator 20 to apply a DC voltage on the Speech Encoder/Decoder and DRAM. The system starts replaying after this delay. Whenever the DC voltage detector 50 detects the finish count of DC voltage, it starts from the beginning and replays the recorded content all over again.

B. When the external selection key is set to Low:

a) If the speaker depresses the Record Button 11 when the DRAMs are full, the Speech Encoder/Decoder 100 keeps recording new speech signals. The address counter of the Speech Encoder/Decoder will not generate a High output after finishing one cycle, so the recording and replay wave generator will not assume the decoding (replay) process. It starts decoding (replay) when the Record Button is released. The decoding (replay) operation will last for one complete cycle because the starting address of replay is exactly the same as the ending address of recording. (The address counter is not reset process when the replay starts. It replays from the ending address of the recording.)

b) If the speaker releases the Record Button before the DRAMs are full, there will be a delay in the record voltage. The DC voltage input circuit 20 generates a DC voltage during this delay and the system starts to replay after the delay. The system is reset and replays from the beginning because the address counter of the Speech Encoder/Decoder 100 is reset. The DC voltage detector resets the address counter and the system replays from the beginning, when a predetermined duration DC voltage is detected.

There are three different conditions in the recording and replay of this second embodiment of the circuit:

If the Record Button continues to be depressed after recording for one cycle, the system replays automatically;

If the Record Button continues to be depressed after recording for one cycle, the system keeps recording new speech signals instead of replaying. It replays only when the Record Button is released and replays the message recorded in the last DRAM cycle before the recording ends.

If the Record Button is released before one DRAM cycle ends, a DC voltage for record delay is output and the system replays automatically after the delay.

i) In the first condition, when the external selection key is set on the High level mode, the address counter in the Speech Encoder/Decoder generates a High level signal for application to the recording and replay pulse generator 90 and causes the WR/ output to be High with the DRAMs full. As the WR/ output changes from Low to High, a pulse is sent to the resetter and to the Speech Encoder/Decoder to reset the address counter. The High WR/ output from the recording and replay pulse generator 90 also enables the DC voltage detecting and time setting circuit to start detecting the DC voltage and time counting. It is also controlled by the output from the DC voltage comparator. The DC voltage detecting comparator continues outputting the High signal level in the DRAM decoding process. The High voltage keeps the time counter in a reset mode (counting stopped). The DC voltage detector and time setter does not have to function because the DRAMs are full and there is no blank DC voltage after decoding, the comparator output remains at a High level.

ii) The second condition is the same as the first except that the external selection key is set to a Low level. The recording and replay wave generator will not generate a High WR/ output when the DRAMs are full. The system does not replay until the Record Button is released. A pulse will not be sent to the resetter to reset the address counter in the Speech Encoder/Decoder. Thus, when the recording finishes, the system replays a complete cycle of recorded messages starting from the point where the recording ends.

iii) In the third condition the Record Button is released before the DRAMs are full. Independently of the setting of the external selection key 65, there will be a record delay. The DC voltage input circuit applies a DC voltage to the DRAM during this delay and the system replays after this delay. The DC voltage detecting and time setting circuit 50 now applies a reset signal on the address counter in the Speech Encoder/Decoder. The address counter starts counting, namely, the memory is read from the beginning to enable decoding. The recorded message content will be replayed while the extra message in the DRAM will not be replayed except the blanks set to control the address counter.

The Speech Encoder/Decoder and DRAM replay under all of these three conditions. The user does not have to touch the Play Button 12 again in order to replay the content one more time. The system will not replay all the blank space in DRAM, it replays the recorded content only. If a user wants to hear the beginning or the content in the middle of the replay process, he just depresses the Play Button.

Figure 7:
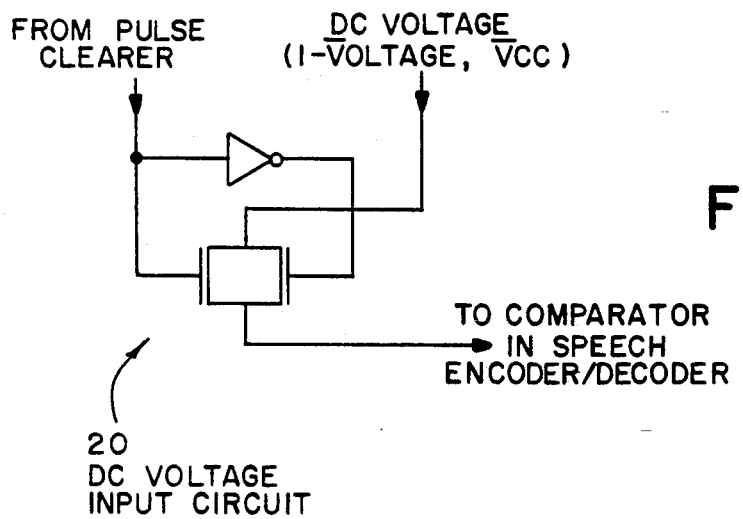
FIG. 7 is a block diagram of a voltage input circuit for use in the system of FIG. 5.
Figure 12A:
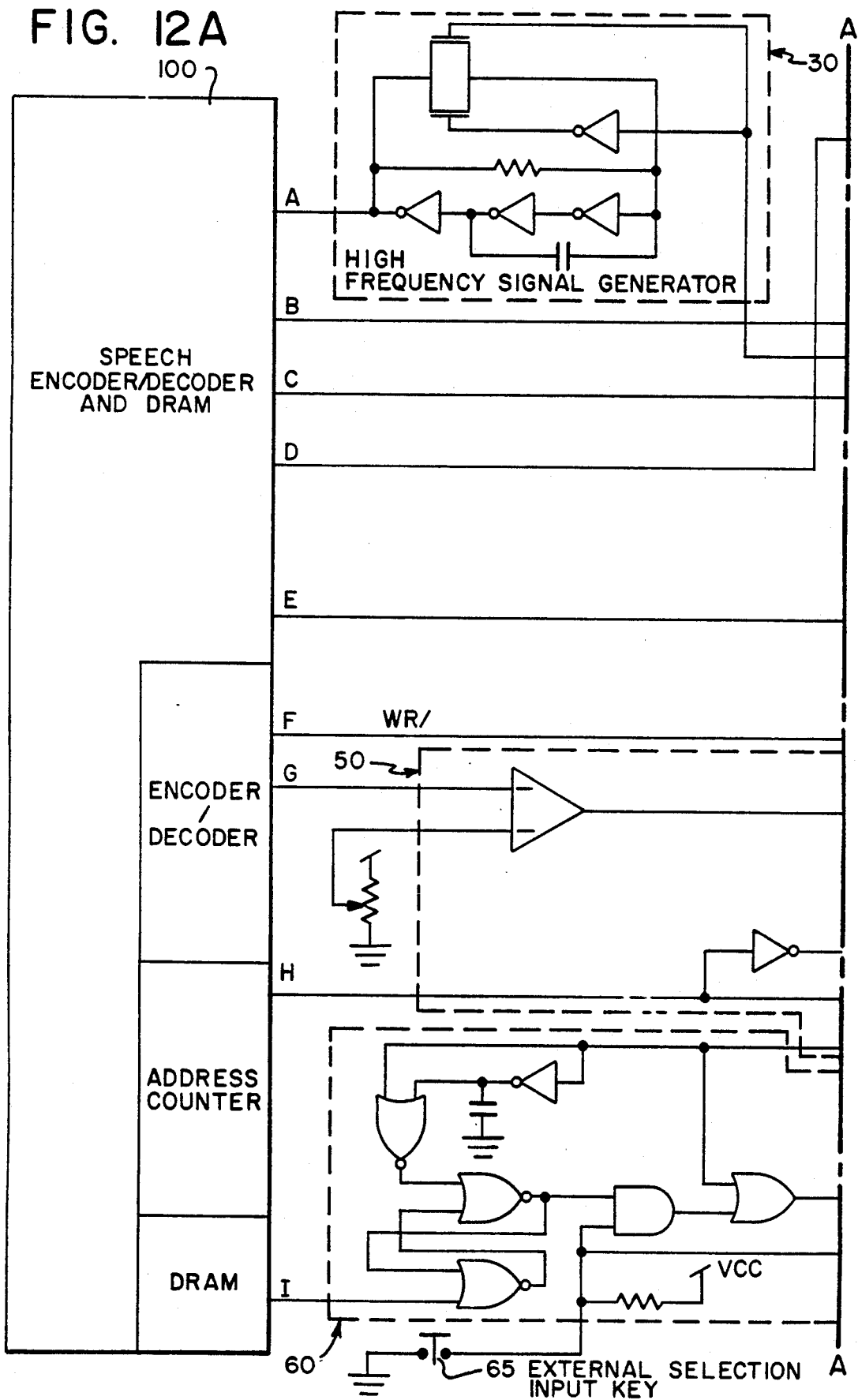
FIG. 12 is a more complete block diagram of the first embodiment of the invention.

Detailed circuit structures of the embodiment of FIG. 12 are shown in FIG. 17. The circuits of the invention are easy to fabricate, clear in logic, and useful. The starting and ending address indexes are not stored in DRAM nor is a CPU needed. This invention does not require the use of complicated expensive circuits. The circuits shown herein are only exemplary, and other equivalent circuits may be employed within the scope of the invention. For example only, there are suitable circuits for the high frequency oscillator that do not require the use of an inverter. Pulse generators that may substitute for those shown in FIG. 13 can be formed by the use of flip-flops or other devices. A transmission gate, such as shown in FIG. 7, can be replaced by a suitable transistor or other device.

The function of the recording and replay pulse generator can be extended by adding an external recording and replay input. A Low level signal is sent by the Record Button when clearing and recording. A High level signal is given when the Record Button is released, and the system replays from the beginning.

Figure 14B:
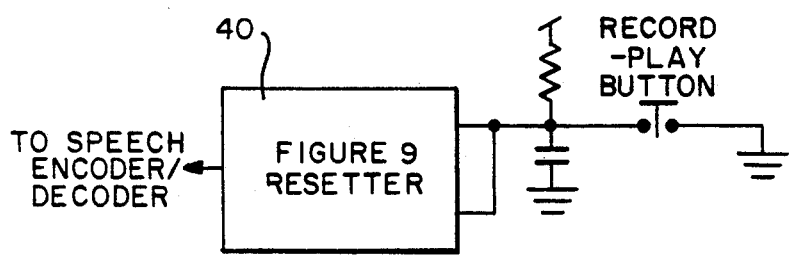

The system may employ a combined Play Button and Record Button, as illustrated in FIG. 14B. Suitable resistor and capacitor values for these buttons are chosen according to conventional design methods.

Figure 18:
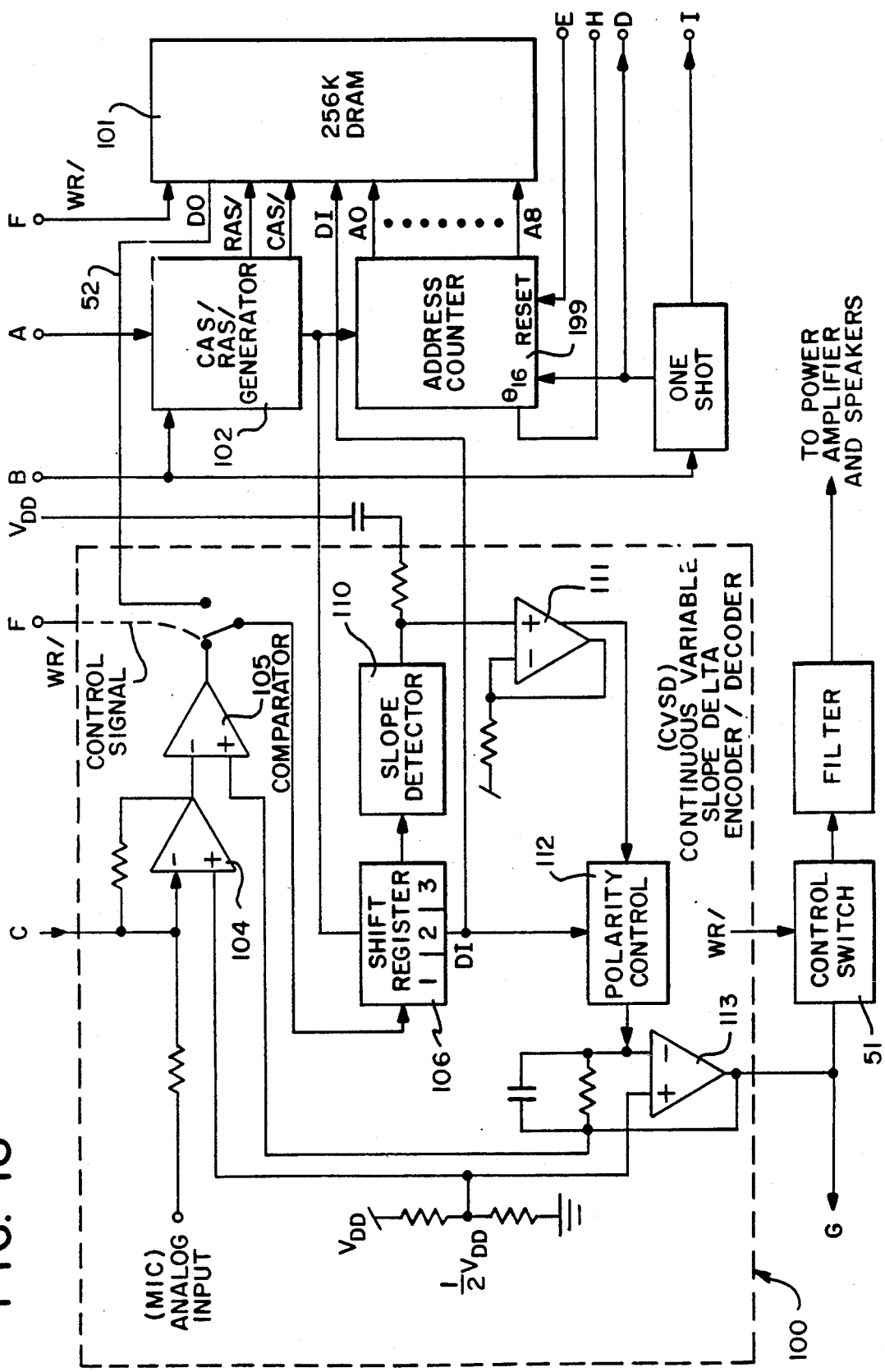
FIG. 18 is a block diagram of a speech encoder-decoder and DRAM circuit for use with the system of FIG. 12.

FIG. 18 is a block diagram of a speech encoder-decoder and DRAM circuit for the circuit of FIG. 12. The interconnections A-I illustrated on this diagram correspond to the interconnections A-I of FIG. 12. The DRAM in this circuit may by conventional DRAM, for example of type TMS4256.

In the operation of the system of the invention, during recording, when the user pushes the record button 11 (FIG. 12), the signal on the WR/ line F goes from a high level to a low level which switches the device to record mode. The low level WR/ signal stops the DC voltage Detector and Time Setter 50 from outputting any signals. A low level WR/ signal also makes the Recording and Playing Pulse Generator 60 generate a one-shot pulse on line 400. This pulse on line 400 is applied to the Resetter 40 and enables the Resetter 40 to output a high level signal on line E. The signal on line E is applied to the Address Counter 199 (FIG. 18) to reset the DRAM 101 address to the initial address. The pulse on line 400 also makes the Pulse Clearer 10 generate a high level signal on line B. The high level signal on line B:

1. Controls the high frequency signal generator 30 to generate a high frequency signal on line A for application to the CAS/, RAS/ generator 102 and Address Counter 199 for generating CAS/, RAS/ signals and addresses A0-A8 for the 256K DRAM for high speed clearing of the DRAM.

2. Enables the DC Voltage Input circuit 20 to output a 0.5 second DC voltage on line C for application to the preamplifier 104 of the Speech Encoder/Decoder of FIG. 18. The voltage on line C causes the output of the preamplifier to be held at zero voltage (mute) during the 0.5 second high speed clearing. This zero voltage signal is sampled by the comparator 105 and shift register 106 and makes the first stage of the shift register output a 0.5 second Mute signal DI. The signal DI is applied to the 256K DRAM 101 and clears all previous data in the DRAM. After the previously stored data has been cleared, the last address A8 of the Address Counter 199 outputs a signal on line D to shut the Pulse Clearer 10 off. The signal on line B is now set to a low level, and the clearing operation is stopped.

3. Controls the CAS/, RAS/ generator 102 to let all DRAMs receive the CAS/ and RAS/ signals so that all DRAMs finish clearing at the same time.

When the pulse clearer 10 is off, the system is in normal recording mode. In this mode, speech signals are conveyed from the Analog Input (MIC) (FIG. 18) to the continuous variable slope delta (CVSD) encoder/decoder. The CVSD encoder/decoder is comprised of the preamplifier 104, comparator 105, shift register 106, slope detector 110, voltage to current (V/I) converter 111, polarity control 112, and integrator 113. The speech signal is first amplified by the preamplifier 104, and then compared by the comparator 105 with $\frac{1}{2} V_{DD}$.

If the output of the preamplifier is higher than $\frac{1}{2} V_{DD}$, the output of the comparator 105 is low. The signal DI, sampled at the first stage of the shift register 106, is stored in the 256K DRAM. At the same time, the signal DI controls the polarity control circuit 112 and the V/I converter 11 to control the integrator to perform positive integration so that the output signal of the integrator on line G will more closely follow the speech signal waveform. When the shift register 106 samples three successive low level signals, the slope detector 110 controls the V/I converter 111 to amplify the integration current so that the output signal of the integrator on line G quickly approaches the speech signals.

If the output of the preamplifier 104 is lower than $\frac{1}{2} V_{DD}$, the output of the comparator 105 will be high. DI is sampled at the first stage of the shift register 106 and is stored in the 256K DRAM. At the same time, DI controls the polarity control circuit 112 and V/I converter 111 so that the integrator 113 performs negative integration and the output signal of the integrator on line G is decreased and more similar to the speech waveform. When the shift register samples three successive high level signals, the slope detector 110 controls the V/I converter 111 to amplify the integration current so that the output signal of the integrator on line G quickly approaches the speech signal waveform. The encoding of the speech signals is then completed.

Releasing the Record Button changes, the WR/ signal on line F to a high level, and the DC voltage detector and time setter 50 detect the DC voltage. The message DO saved in the 256K DRAM is then applied to the shift register 106 directly via line 52, and the shift register 106 applies the signal DO to the Polarity Control 112 and V/I converter 111 to let the output of the integrator on line G start integration from $\frac{1}{2}$ VDD.

When DO has a low level, the integrator performs positive integration to amplify the signal on line G. When DO has a high level, the integrator performs negative integration to decrease the signal on line G. When $D_O$ outputs three signals having the same level, the slope detector 110 controls the integration current to amplify the V/I converter current. The decoding of the speech signals is then completed. At this time, control SW51 sends the output signal of the integrator on line G to the filter, power amplifier, and speaker to start the replay operation.

During the replay process, if the output signal on line G has a continuous period of zero level (mute), i.e., the mute previously saved in the DRAM, the DC voltage detector and Time setter 50 detects this zero level (mute), and generates a one-shot pulse on line 600 (FIG. 12) for application to the resetter 40. This pulse on line 600 enables the resetter 40 to output a signal on line E to the Address Counter 101 to reset the address to the initial address so that the device replays from the beginning.

A speech encoder/decoder and DRAM circuit for use in combination with the circuit of FIG. 17 is similar to that illustrated in FIG. 18, differing only in the omission of signals B and D. A separate oscillator (not illustrated) is a source of oscillations for the CAS/,RAS/ generator 102. The lines identified in FIG. 17 are adapted to be connected to similarly identified lines in FIG. 18.

The circuit of FIG. 17, when connected to the circuit of FIG. 18 as modified in the above manner, the user depresses the Record Button to record. Speech signals enter the analog input MIC and the system starts saving the message DI in the 256K DRAM. When the user releases the Record Button, the Recording and Playing Wave Generator 90 outputs a one-shot pulse on line 800 to change the WR/ signal on line F to a high level, after a short delay. The system is then in the replay mode. The pulse on line 800 is applied to the DC voltage input circuit 20 to let the output voltage thereof on line C be applied to the preamplifier 104 of the CVSD encoder/decoder of FIG. 18. The DC voltage on the line C holds the output of the preamplifier at a zero level (mute) during the above noted time delay. The mute signal is applied to the CVSD encoder/decoder and then saved in the 256K DRAM 101.

When the system is playing, the DC voltage detector and Time Setter 50 detects the mute signal, and then sends a pulse signal on line 600 to the resetter for generating a signal on line E. This signal resets the address counter to its initial address.

The two described embodiments of the invention effect automatic address setting for the recording and playback of speech. The system can work with a memory or a CPU for controlling the address index.

While the invention has been disclosed and described with reference to specific embodiments, it will be apparent that variations and modification may be made therein, and it is therefore intended in the following claims to cover each such variation and modification as falls within the true spirit and scope of the invention.

What is claimed is:

1. An address setting apparatus for storing speech information for recording and replay, comprising:
    a dynamic random access memory (DRAM) for storing the speech information;
    the DRAM also storing a high frequency direct current (DC) voltage as a replay index, indicating the end of stored speech information and preventing decoding of unused DRAM storage.

2. The apparatus of claim 1 further comprising:
    a record button;
    recording means responsive to depression of the record button for recording speech information; and
    means for applying the high frequency DC voltage to the DRAM when the record button is released.

3. The apparatus of claim 1 further comprising:
    a pulse clearer, a DC voltage input circuit, and a speech encoder/decoder having an address counter;
    the pulse clearer including means responsive to power applied to the address counter for setting an output of the pulse clearer to a low logic level;

means responsive to depression of a record button for setting the output of the pulse clearer to a high logic level;

means for directing the output of the pulse clearer to the DC voltage input circuit; and means responsive to the address counter for returning the output of the pulse clearer to a low level when the DRAM is clear;

the DC voltage input circuit comprising means responsive to a high level output of the pulse clearer to direct a DC voltage to the speech encoder/decoder to enable the speech encoder/decoder to clear the DRAM.

4. The apparatus of claim 3 further comprising a high frequency signal generator and means for directing the output of the pulse clearer to the high frequency signal generator, the high frequency signal generator having means for applying oscillations of predetermined frequencies to the DRAM in response to low and high level outputs of the pulse clearer, respectively, fir clearing the DRAM.

5. The apparatus of claim 4 wherein the address counter has a memory, the memory having a beginning, further comprising a resetter, the resetter providing the address counter with a reset pulse to reset the address counter to the beginning of its memory.

6. The apparatus of claim 5 wherein said resetter is responsive to depressing the record button for providing the reset pulse.

7. The apparatus of claim 5 further comprising a play button, and wherein said resetter is responsive to depression of the play button for providing the reset pulse.

8. The apparatus of claim 5 wherein the resetter provides the reset pulse when a recording ends and recording is changed to a replay process.

9. The apparatus of claim 5 further comprising a DC voltage detector and time setter connected between the DRAM and the resetter and responsive to a recording and replay pulse generator to detect when recording is in progress, the DC voltage detector and time setter comprising a voltage comparator for comparing a reference voltage to a voltage received from the speech encoder/decoder and a time counter for comparing a length time of voltage received from the DRAM with a predetermined time, and being non-functional during recording, and outputting a reset pulse to the resetter when a DC voltage from the DRAM is longer than the predetermined time.

10. The apparatus of claim 9 wherein said resetter is connected to provide said reset pulse when the DC voltage detector and time setter apply a reset signal to the DC voltage detector and time setter.

11. The apparatus of claim 5 further comprising a recording and replay pulse generator, and an external recording and replay input, the recording and replay pulse generator outputting a high write (WR/) signal to the speech encoder/decoder in absence of a signal from the external recording and replay input and the record button, said high WR/ signal defining a replay mode, and outputting a low WR/ signal when the record button is depressed or when the external recording and replay input is low, said low WR/ signal defining a rest signal for initiating the resetter to clear said DRAM.

12. The apparatus of claim 11 wherein the replay pulse generator is connected to be responsive to a low replay input, for not changing the WR/ output thereof in response to an end signal form the address counter, the end signal indicating that all DRAM storage is filled and being responsive to a high replay input for changing the WR/ output thereof in response to an end signal form the address counter.

13. The apparatus of claim 12 wherein the recording and replay pulse generator is responsive to depressing the record button for sending an end signal to change the WR/ signal to a high level causing replays after all of the DRAM storage has been decoded, and for generating a reset pulse when the record button is released or when an external selection button is released or when an external selection input goes high and the apparatus begins to replay.

14. An address setting apparatus for recording and replaying speech information comprising:

a dynamic random access memory (DRAM) for storing the speech information;

a speech encoder/decoder having an address counter a recording and replay pulse generator;

a direct current (DC) voltage input circuit having a switching circuit responsive to a low level output of the recording and replay pulse generator for turning the DC voltage input circuit off and responsive to a high level output of the recording replay pulse generator for controlling the DRAM to record a DC voltage;

a resetter for applying a reset wave to said address counter in response to one of:

a) depressing a record button, initiating clearing of the DRAM, b) depressing a play button, initiating replay of the DRAM, and c) an output of a DC voltage detecting and time setter;

a DC voltage detector and time setter comprising a voltage comparator for comparing a reference voltage to a voltage received for the speech encoder/decoder and a time counter for comparing a length of time a voltage is received from the DRAM to a predetermined time, the DC voltage detector and time setter being controlled by the recording and playing pulse generator to be inoperative during recording, and responsive to a DC voltage from the DRAM of longer than the predetermined time to output a reset signal to said resetter; and a recording and replay pulse generator controlled by the record button and an external recording and replay input, where an absence of a signal from the record button and replay input causes the recording and replay pulse generator to apply a high write (WR/) signal to the speech encoder/decoder and to apply a low WR/ signal to the speech encoder/decoder in response to depressing the record button or a low replay input signal, said WR/ signal also being applied to said resetter as a reset signal, to start recording signals in said DRAM.

15. The apparatus of claim 14 wherein said address counter outputs an end signal after recording one DRAM cycle, the end signal being applied to the recording and replay pulse generator and the DC voltage input circuit to instruct the DC voltage input circuit to transmit a DC voltage for recording in said DRAM, and the recording and replay pulse generator applies a low output to the DC voltage input circuit when the record button is released before an end signal is output.

16. The apparatus of claim 15 further comprising an external selection key connected to control the apparatus to record speech data shorter than or equal to one DRAM cycle from the starting point of the address counter, and to record speech data equal to one DRAM cycle from an end address of the previous recording.

17. The apparatus of claim 15 further comprising an external selection key for controlling recording of speech data shorter than or equal to one DRAM cycle from a starting point of the address counter, and for controlling recording of speech data equal to one DRAM cycle from the end address of the previous recording.

18. A method for address setting for a recording and replay comprising the steps of:

storing speech in a dynamic random access memory; and storing a direct high frequency current (DC) voltage in the DRAM as a replay index for preventing decoding of unused DRAM storage.

19. The method of claim 18, further comprising the steps of:

depressing a record button to initiate recording speech;

applying a DC voltage to the DRAM when the record button is released;

detecting the applied DC voltage; and initiating replay of the stored speech information without decoding unused DRAM storage.

* * * * *